(12) United States Patent
Rho et al.

(10) Patent No.: US 8,036,026 B2
(45) Date of Patent: Oct. 11, 2011

(54) SEMICONDUCTOR MEMORY DEVICE AND METHOD FOR OPERATING THE SAME

(75) Inventors: Kwang-Myoung Rho, Gyeonggi-do (KR); Woo-Hyun Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 90 days.

(21) Appl. No.: 12/488,069

(22) Filed: Jun. 19, 2009

(65) Prior Publication Data

US 2010/0290279 A1 Nov. 18, 2010

(30) Foreign Application Priority Data

May 13, 2009 (KR) .................. 10-2009-0041585

(51) Int. Cl.
*G11C 11/14* (2006.01)
(52) U.S. Cl. .................. 365/171; 365/203; 365/230.06
(58) Field of Classification Search .............. 365/171, 365/203, 230.06
See application file for complete search history.

(56) References Cited

U.S. PATENT DOCUMENTS

| 7,057,924 | B2 | 6/2006 | Lammers et al. |
| 7,057,925 | B2 * | 6/2006 | Ooishi et al. .................. 365/171 |
| 7,206,222 | B2 * | 4/2007 | Hidaka ........................ 365/158 |
| 7,277,330 | B2 * | 10/2007 | Ooishi ..................... 365/189.16 |
| 7,660,176 | B2 * | 2/2010 | Hur ............................. 365/203 |
| 2009/0073756 | A1 * | 3/2009 | Yang ............................ 365/171 |
| 2009/0103354 | A1 * | 4/2009 | Yoon et al. .................... 365/158 |

FOREIGN PATENT DOCUMENTS

| KR | 100632942 | 10/2006 |
| KR | 1020080013018 | 2/2008 |
| KR | 1020090026183 | 3/2009 |

OTHER PUBLICATIONS

Notice of Preliminary Rejection issued from Korean Intellectual Property Office on Nov. 29, 2010.
Notice of Allowance issued from Korean Intellectual Property Office on Jul. 29, 2011.

* cited by examiner

*Primary Examiner* — Pho M Luu
(74) *Attorney, Agent, or Firm* — IP & T Group LLP

(57) ABSTRACT

A semiconductor memory device includes a plurality of memory cells configured to store data having a polarity corresponding to a direction of current flowing through a source line and a bit line; and a precharge driving unit configured to precharge the bit line to a voltage corresponding to the data in response to a precharging signal before the data are stored in the memory cells.

10 Claims, 4 Drawing Sheets

US 8,036,026 B2

1

SEMICONDUCTOR MEMORY DEVICE AND METHOD FOR OPERATING THE SAME

CROSS-REFERENCE TO RELATED APPLICATION

The present invention claims priority of Korean Patent Application No. 10-2009-0041585, filed on May 13, 2009, the disclosure of which is incorporated herein by reference in its entirety.

BACKGROUND OF THE INVENTION

The present invention relates to a semiconductor design technology, and more particularly, to a semiconductor memory device capable of storing data by using a magnetic tunnel junction device (MTJ).

A dynamic random access memory (DRAM) and a static random access memory (SRAM) are volatile memory devices that lose data stored in a memory cell when power is interrupted. In recent years, studies on nonvolatile memory devices were carried out. One of nonvolatile memory devices is a magnetic random access memory (MRAM). In particular, an MRAM is considered as a next-generation semiconductor memory device because of its nonvolatile characteristic, high integration density, high speed operation, and low power consumption.

A memory cell of an MRAM, which is a type of a magnetic memory device, includes a transistor performing a switching operation according to an address inputted from the outside, and an MTJ storing data. The MTJ has a magnetoresistance (MR) ratio changing according to magnetization directions of two ferromagnetic materials. An internal circuit of the MRAM detects the change in an amount of current according to the MR ratio and determines whether data stored in the MTJ is "1" or "0".

FIG. 1 illustrates a memory cell architecture of a conventional semiconductor memory device.

Referring to FIG. 1, each of memory cells includes a transistor and an MTJ. For illustration purposes, a memory cell including an NMOS transistor 110 and an MTJ 130 will be described as a representative example.

The NMOS transistor 110 forms a source-drain path between a zeroth source line SL0 and an MTJ 130 and has a gate connected to a zeroth word line WL0. The NMOS transistor 110 is turned on/off in response to the activation of the zeroth word line WL0 which is selected by a row address.

The MTJ 130 includes a free layer 132, a tunnel insulation layer 134, and a pinned layer 136. The free layer 132 is formed of a ferromagnetic material and its magnetization direction is changed by external stimulus, for example, such as a current passing through the MTJ 130. A magnetization direction of the pinned layer 136 is not changed even though external stimulus is applied thereto. The magnetization direction of the pinned layer 136 is fixed by a pinning layer (not shown) formed of an antiferromagnetic material. The tunnel insulation layer 134 may be formed of magnesium oxide (MgO).

A tunneling current flows through the MTJ 130 according to a voltage applied across the MTJ 130, and the magnetization direction of the free layer 132 is determined by a direction of the tunneling current. A resistance of the MTJ 130 becomes small if the magnetization direction of the free layer 132 is identical to the magnetization direction of the pinned layer 136. It becomes large if the magnetization direction of the free layer 132 is not identical to the magnetization direction of the pinned layer 136. In general, the state where the magnetization directions of the free layer 132 and the pinned layer 136 are identical to each other corresponds to data "0",

2 and the state when the magnetization directions of the free layer 132 and the pinned layer 136 are not identical to each other corresponds to data "1".

In other words, the magnetization directions of the free layer 132 and the pinned layer 136 become identical to each other when a positive current larger than a critical current flows by applying a positive voltage higher than a certain level to the free layer 132 with respect to the pinned layer 136. That is, an operation of writing data "0" is performed and the resistance of the MTJ 130 decreases. On the contrary, the magnetization directions of the free layer 132 and the pinned layer 136 become opposite to each other when a negative current larger than a critical current flows by applying a negative voltage higher than a certain level to the free layer 132 with respect to the pinned layer 136. That is, an operation of writing data "1" is performed and the resistance of the MTJ 130 increases.

FIG. 2 is a graph showing a current-voltage characteristic of the MTJ 130 of FIG. 1.

Referring to FIG. 2, paths 1, 8, 9 and 10 represent a case where the free layer 132 and the pinned layer 136 have an opposite magnetization direction to each other, and paths 3, 4, 5 and 6 represent a case where the free layer 132 and the pinned layer 136 have an identical magnetization direction to each other. A path 2 represents a case where a positive current larger than a critical current flows through the MTJ 130 of FIG. 2 and thus magnetization directions of the free layer 132 and the pinned layer 136 change from an opposite direction to an identical direction. A path 7 represents a case where a negative current larger than a critical current flows through the MTJ 130 and thus magnetization directions of the free layer 132 and the pinned layer 136 change from an identical direction to opposite directions.

As can be seen from FIG. 2, the MTJ 130 can have a high resistance and a low resistance due to its hysteresis characteristic, and such a stable state is kept even though power is interrupted.

FIG. 3 is a circuit diagram explaining a write operation of a conventional MRAM.

Referring to FIG. 3, the MRAM includes a plurality of memory cells MC, a source line driving unit 330, a bit line driving unit 350, a precharge driving unit 370. A reference numeral 390 represents parasitic capacitances of zeroth to third bit lines BL0, BL1, BL2 and BL3.

For illustration purposes, the following description will be focused on, a memory cell 310 on which a write operation is performed.

The memory cell 310 is connected between the first bit line BL1 and the first source line SL1 and is enabled in response to the activation of the first word line WL1. Due to the source line driving unit 330 and the bit line driving unit 350, a current larger than a critical current flows through the enabled memory cell 310, and data having a polarity corresponding to the direction of the current is stored in the enabled memory cell 310.

The source line driving unit 330 drives zeroth to second source lines SL0, SL1 and SL2 in response to a first driving control signal CTR1. The first driving control signal CTR1 has a logic level corresponding to the data. The zeroth to second source lines SL0, SL1 and SL2 are commonly connected for reducing an area of the memory cell MC.

The bit line driving unit 350 drives the first bit line BL1 in response to a second driving control signal CTR2. The second driving control signal CTR2 has a logic level corresponding to the data. The bit line driving unit 350 is provided for each of the zeroth to third bit lines BL0, BL1, BL2 and BL3. Only one bit line driving unit 350 corresponding to the first bit line BL1 is illustrated in FIG. 2. A first NMOS transistor TR1 is connected between the bit line driving unit 350 and the first bit line BL1, and is turned on/off in response to a bit line selection signal BS. The bit line selection signal BS is selected by a column address.

The precharge driving unit 370 precharges the zeroth to third bit lines BL0, BL1, BL2 and BL3 to a ground voltage VSS in response to a precharging signal PRE. The precharge driving unit 370 may be implemented with a plurality of NMOS transistors. Specifically, the NMOS transistors are connected between the zeroth to third bit lines BL0, BL1, BL2 and BL3 and a ground voltage terminal to form a source-drain path and have gates receiving the precharging signal PRE.

A write operation of the memory cell 310 will be described below. A precharging operation is performed prior to a write operation. At this point, the precharging signal PRE becomes a logic high level, and the plurality of transistors including a second NMOS transistor TR2 of the precharge driving unit 370 are turned on. Thus, the zeroth to third bit lines BL0, BL1, BL2 and BL3 are precharged to the ground voltage VSS.

The source line driving unit 330 and the bit line driving unit 350 drive the corresponding lines in response to the first driving control signal CTR1 and the second driving control signal CTR2 corresponding to the data after the precharging operation, that is, the precharging signal PRE becomes a logic low level. The zeroth to second source lines SL0, SL1 and SL2 are driven to the corresponding voltage by the source line driving unit 330, and the first bit line BL1 is driven to the corresponding voltage by the bit line driving unit 350 selected by the bit line selection signal BS. When the first word line WL1 is activated, the NMOS transistors of the memory cells including a third NMOS transistor TR3 are turned on. Hence, a current flows through the memory cell 310 according to a voltage difference between the first source line SL1 and the first bit line BL1, and the MTJ of the memory cell 310 stores "1" or "0".

To explain limitations of the conventional semiconductor memory device, an operation of writing data "1" in the memory cell 310 will be described below. Upon the operation of writing data "1", the first driving control signal CTR1 becomes a logic low level and the second driving control signal CTR2 becomes a logic high level.

As mentioned above, the zeroth to third bit lines BL0, BL1, BL2 and BL3 are precharged to the ground voltage VSS by the precharging operation. The first NMOS transistor TR1 is turned on in response to the bit line selection signal BS, and the PMOS transistor of the source line driving unit 330 is turned on. The NMOS transistor of the bit line driving unit 350 is turned on. Therefore, the zeroth to second source lines SL0, SL1 and SL2 are driven to a core voltage VCORE, and the first bit line BL1 is driven to the ground voltage VSS. When the first word line WL1 is driven, the NMOS transistors of the memory cells including the third NMOS transistor TR3 are turned on. That is, a current flows in the following order: a core voltage (VCORE) terminal of the source line driving unit 330, the first source line SL1, the memory cell 310, the first bit line BL1, and the ground voltage (VSS) terminal of the bit line driving unit 350. Through such a current flow, data "1" is stored in the MTJ of the memory cell 310.

In this case, the existing data is maintained because the NMOS transistors of the memory cells corresponding to the unselected zeroth and second word lines WL0 and WL2 are not turned on. However, problems occur in memory cells, other than the target memory cell 310, which are selected by the first word line WL1.

In the precharging operation, the zeroth to third bit lines BL0, BL1, BL2 and BL3 are precharged to the ground voltage VSS. When the first word line WL1 is activated, the NMOS transistors of the corresponding memory cells are turned on. At this point, the core voltage VCORE for writing data "1" is applied through the first source line SL1 to the memory cell 310, and an unwanted current IDIST flows through the memory cells unselected by the bit line selection signal BS, due to a voltage difference between the first source line SL1 driven to the core voltage VCORE and the zeroth, second and third bit lines BL0, BL2 and BL3 precharged to the ground voltage VSS. An amount of the current IDIST gradually decreases while charging a parasitic capacitance 390 of the zeroth, second and third bit lines BL0, BL2 and BL3, but a current flow is still maintained for a relatively short time of several nanoseconds. Such an unwanted current flow IDIST may damage data stored in the corresponding memory cell or may degrade the quality of stored data.

SUMMARY OF THE INVENTION

An embodiment of the present invention is directed to providing a semiconductor memory device capable of precharging a bit line to a different voltage according to data.

In accordance with an aspect of the present invention, there is provided a semiconductor memory device including a plurality of memory cells configured to store data having a polarity corresponding to a direction of current flowing through a source line and a bit line; and a precharge driving unit configured to precharge the bit line to a voltage corresponding to the data in response to a precharging signal before the data are stored in the memory cells.

In accordance with another aspect of the present invention, there is provided a semiconductor memory device including a plurality of memory cells configured to store data having a polarity corresponding to a direction of current flowing through a source line and a bit line; and a first driving unit configured to drive the source line in response to the data; a second driving unit configured to drive the bit line in response to the data; and a transferring unit configured to transfer an output voltage of the first driving unit to the bit line in response to a precharging signal.

In accordance with another aspect of the present invention, there is provided a method for operating a semiconductor memory device, the method including precharging a bit line to a voltage corresponding to data in response to a precharging signal; driving a source line and the bit line in response to the data; and storing, at a corresponding memory cell, the data having a polarity corresponding to a direction of current flowing through the source line and the bit line.

In accordance with the embodiments of the present invention, a bit line can be precharged to a voltage corresponding to the data prior to a write operation. In other words, by changing a precharge voltage of a bit line differently according to data, it is possible to remove a voltage difference between a source line and a bit line connected to a memory cell on which a write operation is not performed. Therefore, it is possible to prevent unwanted current from flowing through a memory cell on which a write operation is not performed.

DESCRIPTION OF SPECIFIC EMBODIMENTS

Other objects and advantages of the present invention can be understood by the following description, and become apparent with reference to the embodiments of the present invention.

Figure 4:
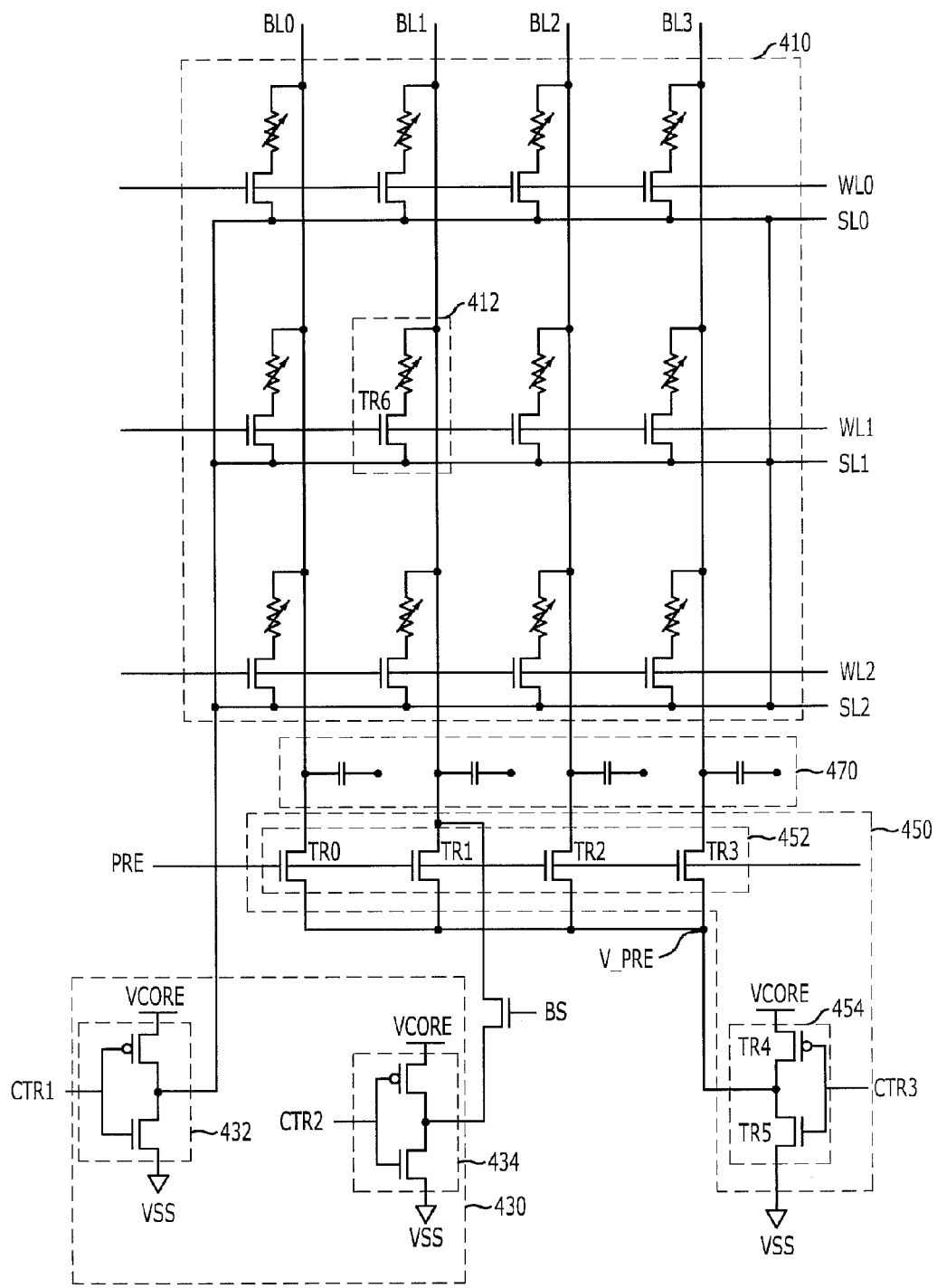
FIG. 4 is a circuit diagram of a semiconductor memory device in accordance with a first embodiment of the present invention.

FIG. 4 is a circuit diagram of a semiconductor memory device in accordance with a first embodiment of the present invention.

Referring to FIG. 4, the semiconductor memory device includes a plurality of memory cells 410, a write driving unit 430, and a precharge driving unit 450. A reference numeral 470 represents parasitic capacitances of zeroth to third bit lines BL0, BL1, BL2 and BL3.

The plurality of memory cells 410 are configured to store data, and each of the memory cells 410 includes a transistor performing a switching operation according to an address, and an MTJ storing data having a corresponding polarity to a direction of current flowing through a source line and a bit line. For example, a memory cell 412 illustrated in FIG. 4 is connected to a first source line SL1 and a first bit line BL1 and stores data having a corresponding polarity to a direction of current flowing through the first bit line BL1 and the source line SL1.

The write driving unit 430 drives the bit lines BL and the source lines SL to a certain voltage in response to first and second driving control signals CTR1 and CRT2 corresponding to the data. The write driving unit 430 includes a source line driving unit 432 and a bit line driving unit 434. The source line driving unit 432 drives zeroth to second source lines SL0, SL1 and SL2 in response to the first driving control signal CTR1, and the bit line driving unit 434 drives the bit line in response to the second driving control signal CTR2. The bit line driving unit 434 is provided for each of the zeroth to third bit lines BL0, BL1, BL2 and BL3. Only one bit line BL1 is illustrated in FIG. 4.

The precharge driving unit 450 precharges the zeroth to third bit lines BL0, BL1, BL2 and BL3 to a voltage corresponding to the data prior to a write operation, that is, before data are stored in the plurality of memory cells. The precharge driving unit 450 includes a voltage driving unit 452 and a voltage supplying unit 454.

The voltage driving unit 452 drives the zeroth to third bit lines BL0, BL1, BL2 and BL3 to a precharge voltage V_PRE of a precharge voltage terminal in response to a precharging signal PRE activated upon a precharge operation. The voltage driving unit 452 includes zeroth to third NMOS transistors TR0, TR1, TR2 and TR3 which are respectively connected between the zeroth to third bit lines BL0, BL1, BL2 and BL3 and the precharge voltage terminal and have gates receiving the precharging signal PRE.

The voltage supplying unit 454 supplies the precharge voltage terminal with the precharge voltage V_PRE corresponding to the data in response to a third driving control signal CTR3. The voltage supplying unit 454 includes a fourth PMOS transistor TR4 and a fifth NMOS transistor TR5 which are connected between a core voltage (VCORE) terminal and a ground voltage (VSS) terminal and have gates receiving the third driving control signal CTR3.

A write operation of the semiconductor memory device in accordance with the embodiment of the present invention will be described below. For illustration purposes, an operation of writing data "1" to the memory cell 412 will be first described. Upon the operation of writing data "1", the first driving control signal CTR1, the second driving control signal CTR2, and the third driving control signal CTR3 become a logic low level, a logic high level, and a logic low level, respectively.

The precharge operation is performed prior to the write operation. In this case, the precharging signal PRE becomes a logic high level, and the zeroth to third NMOS transistors TR0, TR1, TR2 and TR3 of the voltage driving unit 452 are turned on. Thus, the zeroth to third bit lines BL0, BL1, BL2 and BL3 are precharged to the precharge voltage V_PRE. The voltage driving unit 454 drives the precharge voltage V_PRE to the core voltage VCORE in response to the third driving control signal CTR3 of a logic low level. In other words, the precharge driving unit 450 precharges the zeroth to third bit lines BL0, BL1, BL2 and BL3 to the core voltage VCORE corresponding to the data "1" during the precharge operation.

When a bit line selection signal BS is activated after the precharge operation, that is, the precharging signal PRE becomes a logic low level, the write driving unit 430 is activated in response to the first driving control signal CTR1 of a logic low level and the second driving control signal CTR2 of a logic high level. In this case, the zeroth to second source lines SL0, SL1 and SL2 are driven to the core voltage VCORE by the source line driving unit 432, and the first bit line BL1 is driven to the ground voltage VSS by the bit line driving unit 434. When the first word line WL1 is activated, the NMOS transistors of the memory cells including a sixth NMOS transistor TR6 are turned on, and a current flows from the first source line SL1 through the memory cell 412 in a direction of the first bit line BL1. Through such a current flow, data "1" is stored in the MTJ of the memory cell 412.

The following description will be made on memory cells, other than the memory cell 412, which are selected by the first word line WL1.

Figure 1:
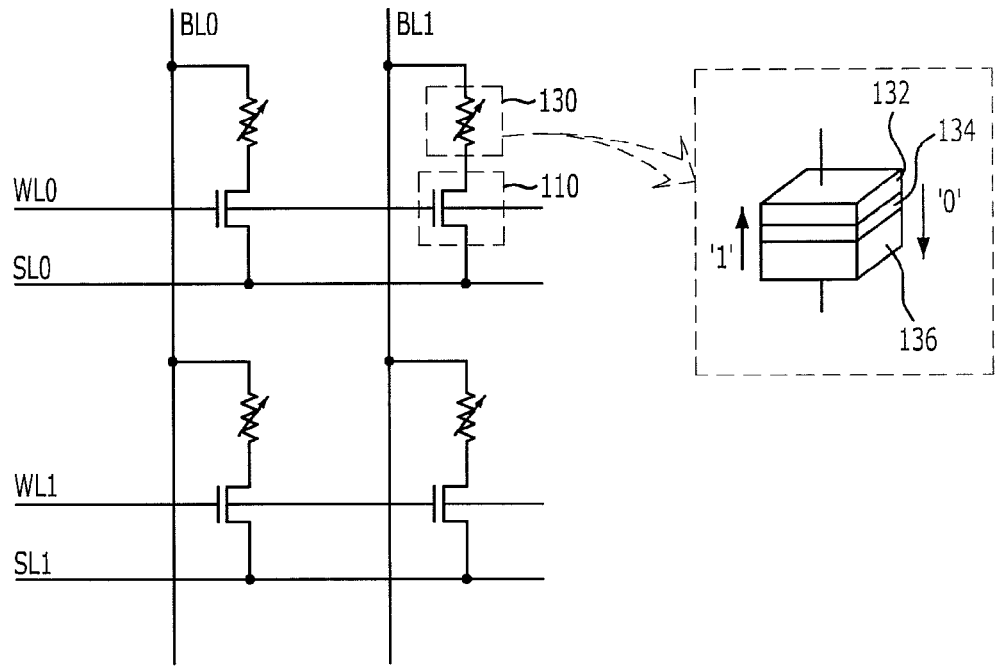
FIG. 1 illustrates a memory cell architecture of a conventional semiconductor memory device.
Figure 2:
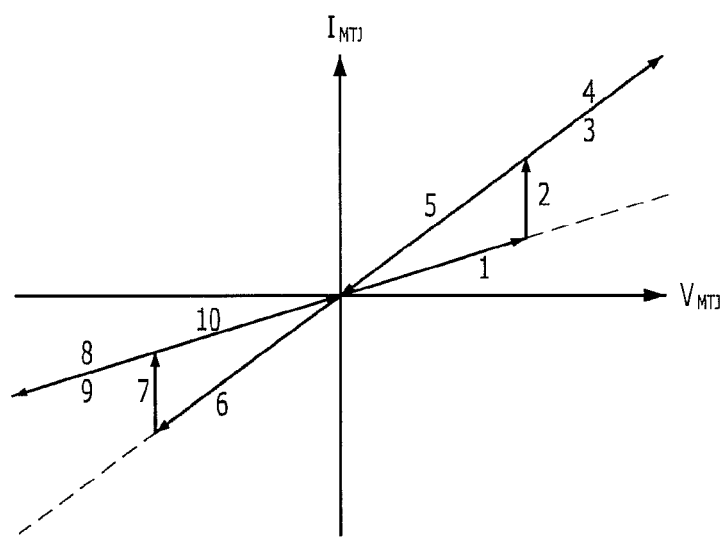
FIG. 2 is a graph showing a current-voltage characteristic of an MTJ of FIG. 1.
Figure 3:
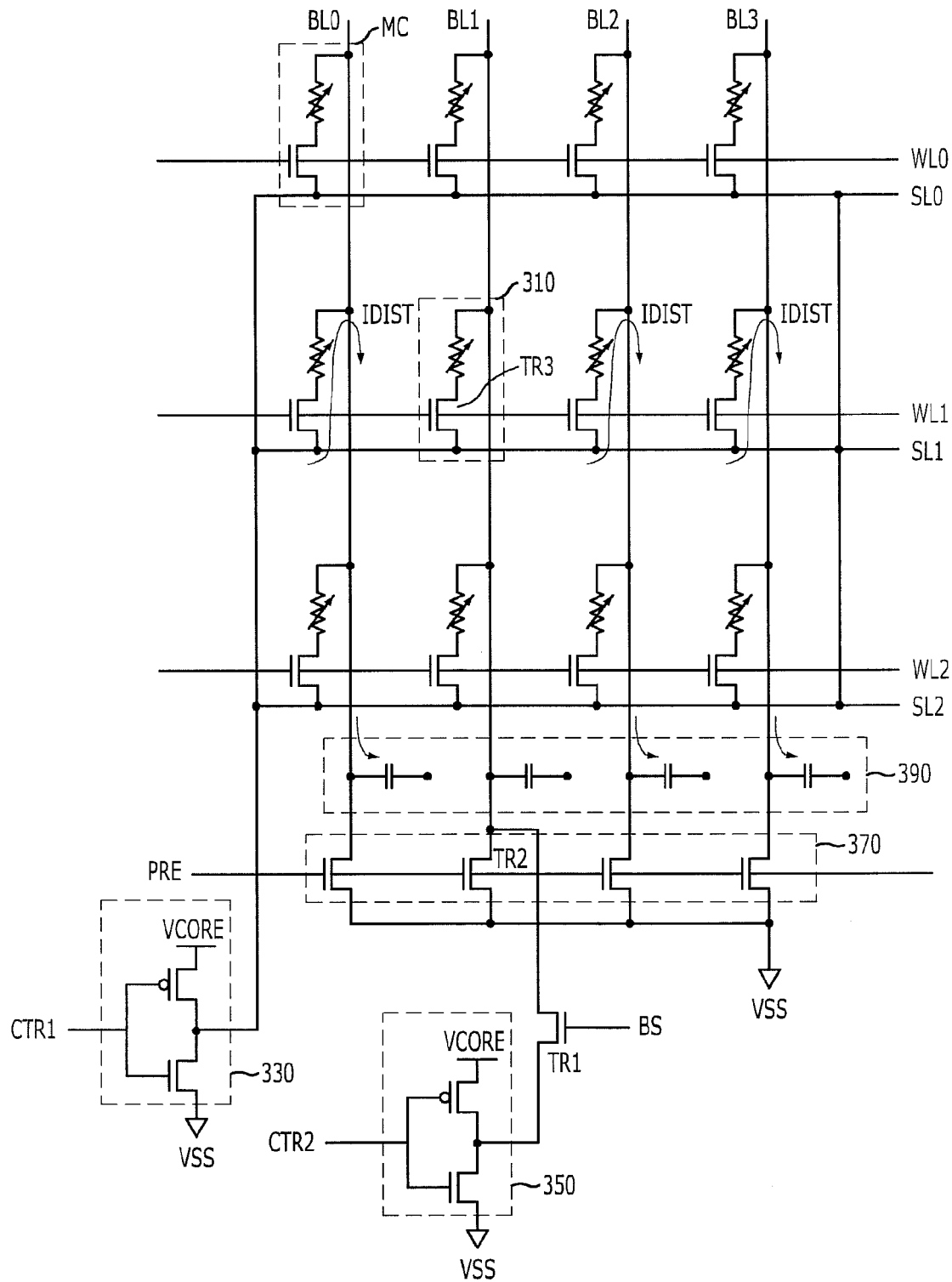
FIG. 3 is a circuit diagram explaining a write operation of a conventional MRAM.

During the precharge operation, the zeroth to third bit lines BL0, BL1, BL2 and BL3 are precharged to the core voltage VCORE corresponding to the data. When the first word line WL1 is activated, the NMOS transistors of the corresponding memory cells are turned on. In this case, the core voltage VCORE for writing data "1" to the memory cell 412 is applied to the first source line SL1, and a voltage difference between the first source line SL1 connected to the memory cells unselected by the bit line selection signal BS and the zeroth, second and third bit lines BL0, BL2 and BL3 disappears. Therefore, unlike in the prior art, unwanted current (IDIST, see FIG. 3) does not occur.

The following description will be made on the operation of writing data "0" to the memory cell 412. Upon the operation of writing data "0", the first driving control signal CTR1, the second driving control signal CTR2, and the third driving control signal CTR3 become a logic high level, a logic low level, and a logic high level, respectively.

The precharge operation is performed prior to the write operation. The zeroth to third bit lines BL0, BL1, BL2 and BL3 are precharged to the precharge voltage V_PRE in response to the precharging signal PRE. The voltage driving unit 454 drives the precharge voltage V_PRE to the ground voltage VSS in response to the third driving control signal CTR3 of a logic high level. In other words, the precharge driving unit 450 precharges the zeroth to third bit lines BL0, BL1, BL2 and BL3 to the ground voltage VSS corresponding to the data "0" during the precharge operation.

After the precharge operation, the write driving unit 430 is activated in response to the first driving control signal CTR1 of a logic high level and the second driving control signal CTR2 of a logic low level. In this case, the zeroth to second source lines SL0, SL1 and SL2 are driven to the ground voltage VSS, and the first bit line BL1 is driven to the core voltage VCORE. When the first word line WL1 is activated, the NMOS transistors of the memory cells including a sixth NMOS transistor TR6 are turned on, and a current flows from the first bit line BL1 through the memory cell 412 in a direction of the first source line SL1. Through such a current flow, data "0" is stored in the MTJ of the memory cell 412.

The following description will be made on memory cells, other than the memory cell 412, which are selected by the first word line WL1.

During the precharge operation, the zeroth to third bit lines BL0, BL1, BL2 and BL3 are precharged to the ground voltage VSS corresponding to the data. When the first word line WL1 is activated, the NMOS transistors of the corresponding memory cells are turned on. In this case, the ground voltage VSS for writing data "0" to the memory cell 412 is applied to the first source line SL1, and a voltage difference between the first source line SL1 connected to the memory cells unselected by the bit line selection signal BS and the zeroth, second and third bit lines BL0, BL2 and BL3 is removed. Therefore, unlike the prior art, unwanted current (IDIST, see FIG. 3) does not occur.

Meanwhile, the voltage supplying unit 454 of the precharge driving unit 450 and the source line driving unit 432 perform similar operations and also have similar structures. Therefore, the voltage supplying unit 454 and the source line driving unit 432 may be implemented with one component in order to reduce an area occupied by them, which will be described below with reference with FIG. 5.

Figure 5:
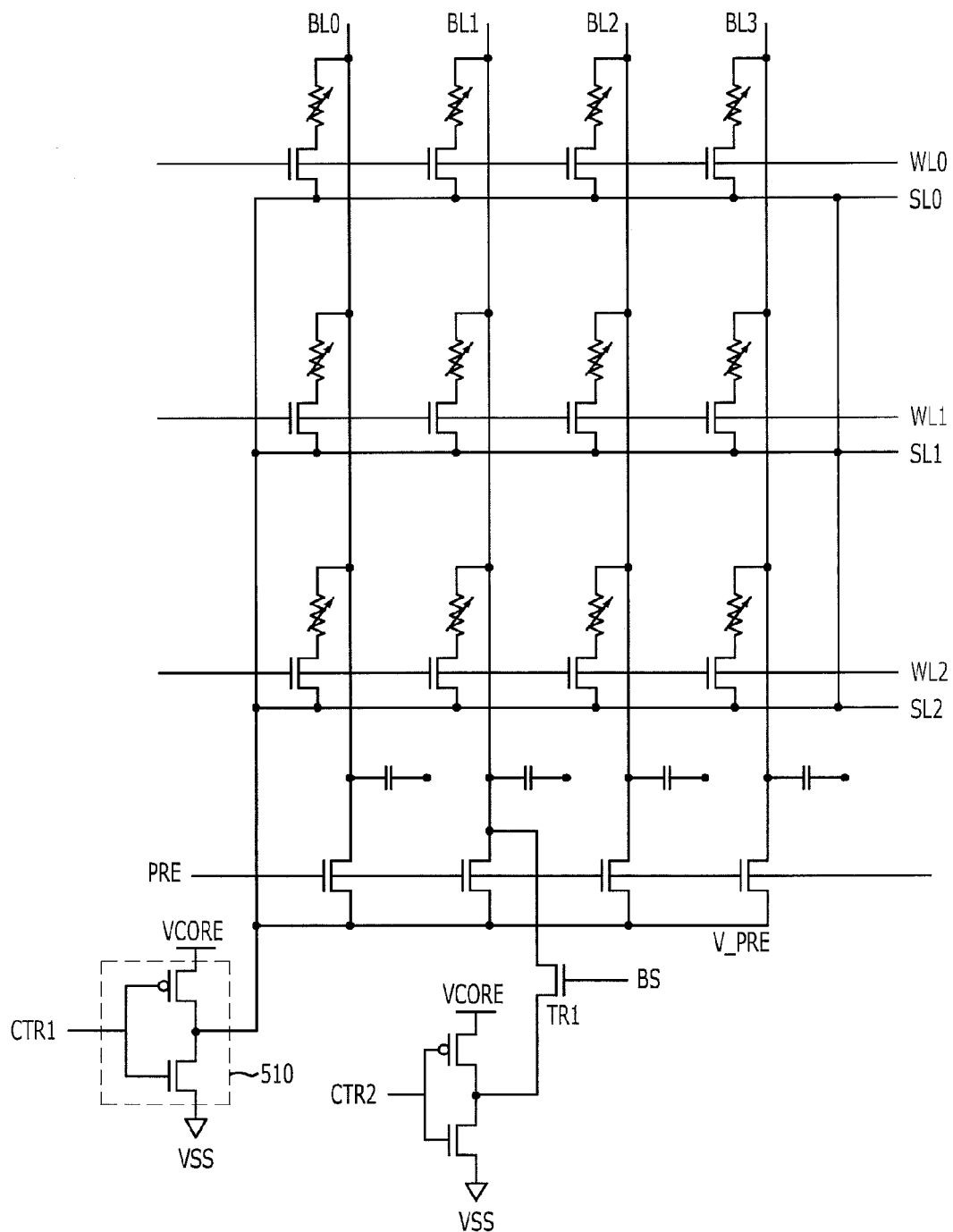
FIG. 5 is a circuit diagram of a semiconductor memory device in accordance with a second embodiment of the present invention.

FIG. 5 is a circuit diagram of a semiconductor memory device in accordance with a second embodiment of the present invention.

Comparing FIGS. 4 and 5, the voltage supplying unit 454 of FIG. 4 is removed, and the output terminal of the source line driving unit 510 of FIG. 5 is connected to the precharge voltage (V_PRE) terminal. Therefore, a plurality of NMOS transistors turned on in response to the precharging signal PRE transfer, to the corresponding bit lines, a voltage driven at the output terminal of the source line driving unit 510, that is, the precharge voltage (V_PRE) terminal. Consequently, the zeroth to third bit lines BL0, BL1, BL2 and BL3 are precharged to a voltage corresponding to the data. Due to the precharged zeroth to third bit lines BL0, BL1, BL2 and BL3, unwanted current (IDIST, see FIG. 3) may be reduced/prevented in the memory cells at which the write operation is not performed.

Although the case where first driving control signal CTR1 and the third driving control signal CTR3 have the same logic level corresponding to the data has been used as an example in the second embodiment, it is apparent that the design of the semiconductor memory device in accordance with the second embodiment may be modified when the first driving control signal CTR1 and the third driving control signal CTR3 have different logic levels in the precharge operation and the write operation in the first embodiment.

In accordance with the embodiments of the present invention, by preventing/reducing an unwanted current from flowing through a memory cell on which a write operation is not performed, it is possible to prevent damage or quality degradation of data stored in the corresponding memory cell. Therefore, a stable operation and reliability of a semiconductor memory device can be improved.

While the present invention has been described with respect to the specific embodiments, it will be apparent to those skilled in the art that various changes and modifications may be made without departing from the spirit and scope of the invention as defined in the following claims.

Furthermore, while the case where the precharge voltage V_PRE is the core voltage VCORE or the ground voltage VSS according to data has been illustrated as examples in the above-mentioned embodiments, the precharge voltage V_PRE may also have the same level as a voltage driven at the source line after the precharge operation.

Moreover, it is apparent that the positions and types of the logic gates and transistors described above will be changed according to polarities of input signals.

What is claimed is:

1. A semiconductor memory device, comprising:
a plurality of memory cells configured to store data having a polarity corresponding to a direction of current flowing through a source line and a bit line; and
a precharge driving unit configured to precharge the bit line to a voltage corresponding to the data in response to a precharging signal before the data are stored in the memory cells,
wherein the precharge driving unit includes
a voltage supplying unit configured to supply a precharge voltage terminal with the voltage corresponding to the data, and
a voltage driving unit connected to the precharge voltage terminal and configured to drive the bit line to a precharge voltage in response to the precharging signal.

2. The semiconductor memory device of claim 1, wherein the memory cells share the source line.

3. The semiconductor memory device of claim 1, wherein the semiconductor memory cells each comprises:
a switching unit configured to perform a switching operation in response to an address; and
a magnetic tunnel junction device (MTJ) connected to the switching unit.

4. The semiconductor memory device of claim 1, further comprising a write driving unit configured to drive the source line and the bit line in response to the data.

5. A semiconductor memory device, comprising:
a plurality of memory cells configured to store data having a polarity corresponding to a direction of current flowing through a source line and a bit line; and
a first driving unit configured to drive the source line in response to the data;
a second driving unit configured to drive the bit line in response to the data; and
a transferring unit configured to transfer an output voltage of the first driving unit to the bit line in response to a precharging signal.

6. The semiconductor memory device of claim 5, wherein the transferring unit and the first driving unit are operated before the data are stored in the memory cells.

7. The semiconductor memory device of claim 5, wherein the memory cells share the source line.

8. The semiconductor memory device of claim 5, wherein the semiconductor memory cells each comprises:
a switching unit configured to perform a switching operation in response to an address; and
a magnetic tunnel junction device (MTJ) connected to the switching unit.

9. A method for operating a semiconductor memory device, the method comprising:
precharging a bit line to a voltage corresponding to data in response to a precharging signal;
driving a source line and the bit line in response to the data; and
storing, at a corresponding memory cell, the data having a polarity corresponding to a direction of current flowing through the source line and the bit line,
wherein precharging a bit line includes
driving a precharge voltage terminal to a voltage corresponding to the data and
driving the bit line to a voltage of the precharge voltage terminal in response to the precharging signal.

10. The method of claim 9, wherein the source line and the precharge voltage terminal are driven to same voltage.

* * * * *